United States Patent [19]

Musser et al.

[11] Patent Number: 4,571,373

[45] Date of Patent: Feb. 18, 1986

[54] EXPOSURE LATITUDE IMPROVEMENT IN PRINTING POSITIVE-ACTING COLOR PRE-PRESS PROOFS

[75] Inventors: Arlene K. Musser, Oakdale; Peter M. Koelsch, Afton, both of Minn.

[73] Assignee: Minnesota Mining and Manufacturing Company, St. Paul, Minn.

[21] Appl. No.: 619,001

[22] Filed: Jun. 11, 1984

[51] Int. Cl.[4] .......................... G03C 5/18; G03C 7/12; G03F 3/10
[52] U.S. Cl. .......................................... 430/143; 430/5; 430/30; 430/148; 430/293; 430/358; 430/359
[58] Field of Search ................... 430/143, 5, 293, 358, 430/359, 148, 30

[56] References Cited

U.S. PATENT DOCUMENTS

| | | | |
|---|---|---|---|
| 3,069,268 | 12/1962 | Herrick | 430/148 |
| 3,649,268 | 3/1972 | Chu et al. | 96/27 |
| 3,661,591 | 5/1972 | Reed | 430/148 |
| 3,671,236 | 6/1972 | Van Beusekom | 96/15 |
| 4,262,071 | 4/1981 | Larson | 430/11 |
| 4,343,876 | 8/1982 | Heiart et al. | 430/5 |
| 4,506,003 | 3/1985 | Ruckert et al. | 430/311 |

*Primary Examiner*—Charles L. Bowers, Jr.
*Attorney, Agent, or Firm*—Donald M. Sell; James A. Smith; Mark A. Litman

[57] ABSTRACT

The exposure latitude of positive-acting, color pre-press proofing photosensitive articles can be improved by positioning an optical filter between the separation halftone positive and the photosensitive article.

4 Claims, No Drawings

EXPOSURE LATITUDE IMPROVEMENT IN PRINTING POSITIVE-ACTING COLOR PRE-PRESS PROOFS

BACKGROUND OF THE INVENTION

1. Field of the Invention

This invention relates to color pre-press proofing images and processes. In particular it relates to materials and processes which improve the exposure latitude of positive proofs and which can be used to adjust the dot size.

2. Background of the Art

It is highly desirable to inspect the image that will be produced from a printing process prior to the start of on-line printing operations. This is particularly true in color printing processes where both image resolution and color quality must correlate with the original subject matter. An inspection of the proofing image before actual printing of the image provides the operator with an opportunity to adjust the press, plate, ink, film separations, and other conditions to produce a printed product with the desired characteristics.

As is known in the art, color separations can be made from originals, employing red, green and blue filters. The method of producing color separation negatives or positives from the originals is well known in the art. From the original color image, one goes by conventional routes to form positive or negative color separations representing the red, green, and blue record of the original. For the lithographic process, it is of course required that these records be half-tone renditions. These half-tone separations may be used at this point to form printing plates or pre-press proofs.

Color separations made from the original image may represent a faithful replication of tonal values, and the proofing methods used to make colored representations of these half-tone separations may also reproduce the quality seen in the photomechanically produced originals. However, when these high quality color proofing separations are viewed against the output of a high quality printing press, the results do not always correspond, especially when mid-tone half-tone values are compared. This lack of correspondence is the result of the printing press producing a half-tone dot size on paper that is larger than the half-tone dots present on the printing plate or color separation itself. The net observable result is what is called in the trade as "press gain" or "dot gain", produced by the action of a series of moving cylinders spreading out the ink on the final receptor sheet to cover a larger area than is represented by the imaged printing plate or color proofing originals.

These problems have been recognized in the printing trade and certain adjustments, or compensating techniques have been developed to adjust for these variations. However, prior to this invention, there have been no established reproducible process capable of being accomplished in a non-chemical technical manner with presently available instrumentation for determining the degree of corrections needed.

Color proofing systems are well known and are disclosed in the prior art. The techniques of progressing from an original piece of colored art work through a series of color separations (either negatives or positives), the choice of appropriate color filters to create the specific color rendition on a piece of photographic film, and the use of the separations to generate color proofing separations are well known in the industry.

The methods of combining these individual color separations as well as the means of producing the proper color characteristics are the basis for many patents in this field of photomechanical technology.

U.S. Pat. No. 3,671,236 discloses a pigmented, composite structure on a temporary support capable of being laminated to printing stock, then exposed through a separation negative, and developed to remove the unwanted nonexposed background sections of the color film. Repeating this process for the other colors comprising the original art work and firmly adhering these colored renditions in exact registration one over the other results in a colored, pictorial representation of the original colored piece.

U.S. Pat. No. 3,649,268 discloses the use of a photopolymerizable structure which, when laminated and then exposed through a positive separation transparency, may be colored in the unexposed, tacky regions with a preselected toner powder chosen to match the particular separation color and the ink to be used on press. A multi-layer composite structure is prepared by repeating the coloring process for each of the separation positives and then repeating the steps of laminating, exposing and color to produce a single composite sheet.

U.S. Pat. No. 4,262,071 addresses some of the problems of dot gain by using an optical spacer layer between the half-tone image and the substrate. This spacer imitates dot gain by an optical effect.

SUMMARY OF THE INVENTION

The present invention relates to materials and processes used to improve exposure latitude in positive-acting color pre-press proofing systems. An optical filter is used between the exposing light source and the light-sensitive proofing element. The filter must absorb radiation in the region of maximum absorbance of the light-sensitive material.

DETAILED DESCRIPTION OF THE INVENTION

The positioning of an optical filter between the exposing radiation source and a light-sensitive proofing element has been found to provide a number of benefits. When the filter is placed with a separation half-tone positive image between the light-sensitive (radiation-sensitive) element and the filter, exposure latitude is significantly improved. When the filter element is placed between the separation half-tone positive and the radiation-sensitive element, dot size may be adjusted. The latter construction comprises the present invention.

A number of different positive-acting pre-press color proofing systems are available. The system described in U.S. Pat. No. 4,260,673 uses positive-acting photosensitizers such as diazo oxides as the light sensitive material. The system described in U.S. Pat. No. 3,649,268 uses free radical photoinitiators as the light sensitive agent. These light sensitive materials may also be spectrally sensitized by dyes, but this is not necessary. Most of the light-sensitive, or more properly named radiation sensitive materials have a natural sensitivity to ultraviolet radiation. Exposure to ultraviolet radiation through the separation half-tone transparency has, therefore, become standard in the art. The filters generally useful in the practice of the present invention where the radiation-sensitive element is most sensitive to ultraviolet radiation would, therefore, filter at least some ultraviolet radiation within the electromagnetic spectrum. Yellow filters are most useful for this purpose, but orange, red, magenta, green, etc. can be used. Of course, the filters must not absorb so much of the radiation that no exposure of the radiation sensitive element occurs. To meet this end, the filter should have a transmission optical density of between 0.50 and 2.5. Preferable the filter will have a transmission optical density of between 0.8 and 2.0 at a major absorptive peak of the radiation sensitive material. For example, the diazo oxides often used in positive-acting light sensitive systems tend to have two absorptive peaks, one below 370 nanometers and one above 370 nanometers. Titania filled backing layers absorb radiation in the lower range, but do not absorb much in the higher range. In such a construction it would be desirable to have the filter] layer absorb strongly in the range of the peak over 370 nm, and allow most or all of the radiation below 370 nm to pass.

EXAMPLE 1

The filter can be used only for anti-halation by placing it either between the separation and exposure frame glass or by attaching it to the top of the glass. No control of dot gain can be exercised in this construction. The performance of the material does not seem to be affected by minor scratches or wrinkles resulting from normal handling. Exposure of a commercially available positive-acting pre-press color proof, Positive Matchprint (PMP Cyan 25) were carried out with high, medium, and low density filters over a wide range of times in both the first and the third down positions. Greater improvements in exposure latitude, as well as longer exposure times, are seen as filter density is increased. These data are summarized below.

The Filter Density is reported in terms of the percentage of radiation absorbed at the wavelength of maximum absorbence for the filter. Improvement in Exposure Latitude is the change in the number of steps of the range of highlight exposure. Exposure is through an 11-step grey scale wedge with 0.15 optical density units difference between steps. Resolution at 2X is the resolution of the image at twice the normal exposure at step 5 of the grey scale. The Relative Exposure Time is the relative amount of time for exposure with the filter as compared to exposure without the filter on the PMP Cyan 25 sample.

The Exposure Latitude is measured and reported in two different ways. Both demonstrate increased exposure latitude as the density of the yellow filter is increased. "Improvement in Pos. Exposure Latitude" shows a comparison of resolution in the following manner. A level of fine line resolution was observed at the optimal exposure level (an exposure sufficient to remove all image just past step 3 on the 11-step grey scale with no filter. Grey scale levels (all higher grey scales with no image past step 3, meaning at greater exposure levels) were then determined at which the same photosensitive element, exposed through each filter, gave this same level of resolution. The difference in values between these grey scale levels (with and without filter) are then reported. "Resolution At 2X" is determined as follows.

As halation takes effect in a positive-acting system, fine-line detail tends to be undercut and lost with increased exposure. The greater the effect of halation, the greater the loss in fine-line detail. The data here lists the finest lines resolved at a double-normal MPP exposure [measured with 11-step (0.15 O.D.) Grey Scale]. This gives a comparison of material exposed through no filter with material exposed through the series of filters of increasing density. A higher number here is indicative of a lower effect on resolution due to halation, and therefore is indicative of greater exposure latitude.

TABLE 1

| Filter Density | Improvement in Pos. Exposure Latitude | Resolution at 2X | Relative Exposure Time |
|---|---|---|---|
| No Filter | 0.0 | 18 li/mm | — |
| Low | 0.8 | 36 li/mm | 2-3 times longer |
| Medium | 1.5 | 60 li/mm | 4 times longer |
| High | 1.5 | 114 li/mm | 6 times longer |
| Kokomo Filter | 2.8 | 144 li/mm | 7 times longer |

EXAMPLE 2

An extensive study of the yellow overlay filter as a dot sharpening tool was also performed. The filter can be used for this purpose by placing it *between* the exposure tool and the surface of the Positive Matchprint. The study compared the optical dot gains of four-color PMP proofs made using two different density filters with the gains in a proof made under standard conditions. The filters used were low (Amax 0.87) and medium-high density (Amax 2.46) coated onto 2 mil polyester. Dot gains were measured with a Gretag densitometer over the entire tonal range (4-96%/150 line screen) after exposures with a 5KW photopolymer bulb at a large variety of times. The following table shows the effect of the filters on dot gain in the midtone region. Dot gains of PMP at 45% screen (150 line) exposure units are shown in parenthesis. The results in Table 2 demonstrate that, when a filter is used, greater sharpening of the midtone dots occurs before significant loss of highlight dots (4%) occurs. The data under "standard 4% dots" relates to dots sharpened without a filter by overexposure, and still holding 4% dots. Filter 1 was a low density filter (absorbance at maximum wavelength equals 0.93%) and Filter 2 was a medium-high density filter (absorbance at maximum wavelength equals 2.4%).

TABLE 2

| Color | Standard | Standard 4% dots | Sharpened with filter 1, still holding, 4%'s | Sharpened with filter 2, still holding 4%'s |
|---|---|---|---|---|
| Cyan, 1st down | 24 (10) | 20 (16) | 17 (60) | 15 (150) |
| Magenta, 2nd down | 24 (13) | 22 (26) | 17 (70) | 15 (120) |
| Yellow, 3rd down | 24 (14) | | 16 (60) | 14 (150) |
| Black, 4th down | 24 (25) | - can be sharpened if necessary by additional exposure. | | |

EXAMPLES 3-10

The following data in Table 3 show the relative consistency of dot gain among the various color layers in each of the different constructions when the filter layer is between the half-tone mask and the photosensitive layer (positive-acting Matchprint ® proofs were used.)

TABLE 3

| | Color | Exposure Time | Optical Gain | | | | |
|---|---|---|---|---|---|---|---|
| | | | 4% | 24% | 45% | 66% | 86% |
| Set 1 | Yellow | 150 units | 6 | 16 | 15 | 14 | 6 |
| | Magenta | 120 units | 1 | 15 | 16 | 15 | 7 |
| | Cyan | 105 units | 0 | 14 | 16 | 16 | 8 |
| Set 2 | Yellow | 70 units | 3 | 14 | 15 | 14 | 6 |
| | Magenta | 50 units | 4 | 18 | 17 | 16 | 7 |
| | Cyan | 30 units | 1 | 18 | 19 | 17 | 8 |
| Set 3 | Yellow | 120 units | 5 | 16 | 17 | 15 | 6 |
| | Magenta | 150 units | 3 | 17 | 17 | 15 | 7 |
| | Cyan | 75 units | 1 | 17 | 18 | 17 | 8 |
| Set 4 | Yellow | 70 units | 4 | 18 | 17 | 15 | 7 |
| | Magenta | 70 units | 3 | 18 | 18 | 16 | 7 |
| | Cyan | 35 units | 4 | 19 | 19 | 17 | 8 |
| Set 5 | Cyan | 150 units | 2 | 15 | 15 | 15 | 6 |
| | Magenta | 150 units | 1 | 19 | 17 | 15 | 7 |
| | Yellow | 150 units | 3 | 14 | 14 | 14 | 6 |
| Set 6 | Cyan | 50 units | 2 | 17 | 18 | 16 | 8 |
| | Magenta | 65 units | 2 | 17 | 18 | 15 | 7 |
| | Yellow | 60 units | 3 | 16 | 16 | 15 | 7 |
| Set 7 | Cyan | 150 units | 1 | 15 | 15 | 15 | 7 |
| | Magenta | 120 units | 1 | 15 | 15 | 14 | 6 |
| | Yellow | 120 units | 4 | 14 | 14 | 14 | 6 |
| Set 8 | Cyan | 60 units | 2 | 15 | 17 | 16 | 7 |
| | Magenta | 70 units | 0 | 16 | 17 | 16 | 7 |
| | Yellow | 70 units | 3 | 15 | 14 | 15 | 7 |

In order to give further illustration of the performance of the system, data were plotted over the entire tonal range for each color at the longest exposure time at which all of the 4% dots remained. They may have been slightly shrunken or slightly non-uniform but were all present. In all of the following sets black did not require the use of a filter (due to low coverage in most actual proofs) so the black was completely exposed out in its usual fourth down position. The sets of exposures made included the following:

Set 1
Color order: Yellow, Magenta, Cyan, Black Filter: Yellow filter with 2.46% absorbence at the wavelength of maximum absorbence positioned between the proof and original with the coated side down.

Side 2
Color order: Yellow, Magenta, Cyan, Black Filter: Low density yellow filter positioned between the proof and original with the coated side down.

Set 3
Color order: Yellow, Magenta, Cyan, Black Filter: Yellow filter with 2.46% absorbence positioned between the proof and original with the coated side up.

Set 4
Color order: Yellow, Magenta, Cyan, Black Filter: Yellow filter with 0.87% absorbence at the wavelength of maximum absorbence positioned between the proof and original with the coated side up.

Set 5
Color order: Cyan, Magenta, Yellow, Black Filter: Yellow filter with 2.46% absorbence positioned between the proof and original with the coated side down.

Set 6
Color order: Cyan, Magenta, Yellow, Black Filter: Yellow filter with 0.87% absorbence positioned between the proof and original with the coated side down.

Set 7
Color order: Cyan, Magenta, Yellow, Black Filter: Yellow filter with 2.46% absorbence positioned between the proof and original with the coated side up.

Set 8
Color order: Cyan, Magenta, Yellow, Black Filter: Yellow filter with 0.87% absorbence positioned between the proof and original with the coated side up.

It can be seen by the data that for the color laydown yellow, magenta, cyan, black the placement of the filter coated side up or down shows no significant difference in dot gain. Only the cyan shows a significant difference in dot gain when a medium high density filter was used instead of the low density filter. It is important to note in this case that dot gain reduction was made with a considerably longer exposure time (105 units vs. 30 units). For the yellow and magenta it would be much more advantageous to use the low density filter and thus a much shorter exposure time (70 units). The medium high density filter serves only to prolong the exposure time, for the yellow and magenta, with very little additional reduction in dot gain. For the proofs having the color laydown cyan, magenta, yellow, and black, the cyan again was the only color that showed significantly greater ability to reduce dot gain by using the medium high density filter versus the low density filter. Again the improvement was made at a sacrifice in exposure time (180 units versus 50 units). In this case the increase in exposure time was not as much as in the yellow, magenta, cyan and black laydown proofs. It was interesting to note that all of the colors showed some reduction in dot gain when the filters were positioned coated side up. The only really significant reduction was seen with the medium high density filter placed coated side up during the exposure of the Cyan. Why this case is so different from the others is not clear. For the exposure of the yellow and magenta it would be more advantageous to use the low density filter since the medium high density filter shows no significant improvement in dot gain for the large increase in exposure time (150 units versus 70 units).

EXAMPLE 11

The use of the filter layer of the present invention was also evaluated for use with negative-active Matchprint ® proofs. A medium density filter (absorbance of 1.5) ws used between the half-tone mask and the proof. The data shown in Table 4 indicate that no consistent dot gains can be provided in the negative system. The invention as described does not appear to work in a negative proofing system.

TABLE 4

| Color | Exposure Time | 150 line dot | | | | Dmax |
|---|---|---|---|---|---|---|
| | | 20% | 40% | 60% | 80% | |
| Low density | | | | | | |
| Yellow | 85 sec | 21 | 26 | 21 | 13 | 1.05 |
| Magenta | 50 sec | 18 | 23 | 20 | 12 | 1.35 |
| Cyan | 35 sec | 14 | 19 | 18 | 12 | 1.16 |
| Black | 200 sec | 12 | 16 | 18 | 11 | 1.63 |

Medium density filter Amax = 1.5

EXAMPLE 12

This example demonstrates the ability, using the antihalo filter between separation and proofing material, to steadily reduce dot gains as exposure is increased.

A series of exposures (75, 105, 120, and 150 units) was carried out by placing the yellow filter (Amax=2.46, coated side down, between the proof and original for each color in the following laydown order: Cyan, Magenta, Yellow, and Black. As in previous examples, exposures were carried out with a 5 KW Diazo source, and dot gains were read on a 150-line halftone screen using the Murray-Davies equation. Dot gains for each color over the series of increasing exposure times are listed in Table 5. One can see the effect of increased exposure times in gradually reducing dot gain.

TABLE 5

| Color | EXPOSURE TIME (UNITS) | OPTICAL GAIN AT % SCREEN LISTED | | | | |
|---|---|---|---|---|---|---|
| | | 4% | 24% | 45% | 66% | 86% |
| Cyan | 75 Units | 6 | 22 | 21 | 18 | 8 |
| | 105 Units | 5 | 19 | 19 | 17 | 8 |
| | 120 Units | 2 | 18 | 17 | 16 | 7 |
| | 150 Units | 2 | 15 | 15 | 15 | 6 |
| Magenta | 75 Units | 11 | 25 | 24 | 19 | 9 |
| | 105 Units | 5 | 21 | 21 | 17 | 8 |
| | 120 Units | 5 | 20 | 19 | 16 | 7 |
| | 150 Units | 1 | 19 | 17 | 15 | 7 |
| Yellow | 75 Units | 5 | 19 | 19 | 17 | 8 |
| | 105 Units | 3 | 16 | 16 | 15 | 7 |
| | 120 Units | 3 | 15 | 15 | 14 | 7 |
| | 150 Units | 3 | 14 | 14 | 14 | 6 |

We claim:

1. A process for improving the exposure latitude in a positive-acting color pre-press proofing photosensitive article comprising the steps of:
   (1) placing an optical filter between said color pre-press proofing photosensitive positive-acting article and a source of actinic radiation, said optical filter having a transmission optical density of between 0.5 and 2.5 at a major radiation absorption peak of said photosensitive article, and
   (2) placing a separation half-tone positive image, between said optical filter and the source of radiation, and
   (3) exposing said photosensitive positive-acting article with actinic radiation which passes from said source of actinic radiation and through said optical filter and said half-tone positive image to said photosensitive article.

2. The process of claim 1 wherein said positive-acting photosensitive article comprises a substrate carrying a binder mixed with a positive-acting diazo oxide.

3. The process of claim 2 wherein said optical filter has a separation half-tone positive image between it and said photo-sensitive article.

4. The process of claim 1 wherein said exposing is performed on a number of identical proofing articles at different exposure intensities so that relative dot gain can be evaluated.

* * * * *